(12) United States Patent
Sugeta et al.

(10) Patent No.: US 7,189,499 B2
(45) Date of Patent: Mar. 13, 2007

(54) METHOD OF FORMING FINE PATTERNS

(75) Inventors: Yoshiki Sugeta, Kanagawa-ken (JP); Fumitake Kaneko, Kanagawa-ken (JP); Toshikazu Tachikawa, Kanagawa-ken (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 418 days.

(21) Appl. No.: 10/602,883

(22) Filed: Jun. 25, 2003

(65) Prior Publication Data

US 2004/0067452 A1     Apr. 8, 2004

(30) Foreign Application Priority Data

Jun. 26, 2002    (JP)    ............... 2002-186198

(51) Int. Cl.
*G03C 5/00*    (2006.01)
*B05D 3/02*    (2006.01)

(52) U.S. Cl. ............. 430/324; 430/313; 430/315; 430/322; 430/330; 427/271; 427/372.2; 427/384; 427/385.5; 438/760

(58) Field of Classification Search ............. 430/273.1, 430/313, 315, 322, 324, 330; 427/271, 372.2, 427/384, 385.5; 438/760
See application file for complete search history.

(56) References Cited

U.S. PATENT DOCUMENTS 6,486,058 B1 * 11/2002 Chun .................... 438/637

FOREIGN PATENT DOCUMENTS

| CN | 1314931 A | 9/2001 |
|---|---|---|
| JP | 64-023535 | 1/1989 |
| JP | 1-307228 | 12/1989 |
| JP | 4-364021 | 12/1992 |
| JP | 5-166717 | 7/1993 |
| JP | 5-241348 | 9/1993 |
| JP | 7-45510 | 2/1995 |
| JP | 10-73927 | 3/1998 |
| JP | 11-204399 | 7/1999 |
| JP | 11-283910 | 10/1999 |
| JP | 2000-347414 | 12/2000 |
| JP | 2001-19860 | 1/2001 |
| JP | 2001-109165 | 4/2001 |
| JP | 2001-281886 | 10/2001 |

OTHER PUBLICATIONS

"Extended Abstracts", (The 42$^{nd}$ Spring Meeting, 1995); *The Japan Society of Applied Physics and Related Societies*, No. 2.
"Extended Abstracts", (The 55$^{th}$ Autumn Meeting, 1994); *The Japan Society of Applied Physics*, No. 2.
*Proceedings SPIE*, vol. 4345, pp. 647-654.

* cited by examiner

*Primary Examiner*—Christopher G. Young
(74) *Attorney, Agent, or Firm*—Wenderoth, Lind & Ponack, L.L.P.

(57) ABSTRACT

It is disclosed a method of forming fine patterns comprising: covering a substrate having photoresist patterns with an over-coating agent for forming fine patterns, removing the unwanted over-coating agent that has been deposited on the edge portions and/or the back side of the substrate, applying heat treatment to cause thermal shrinkage of the over-coating agent so that the spacing between adjacent photoresist patterns is lessened by the resulting thermal shrinking action, and removing the over-coating agent substantially completely. The invention provides a method of forming fine patterns which has high ability to control pattern dimensions and provide fine patterns that have a satisfactory profile and satisfy the characteristics required of semiconductor devices, with an additional capability of preventing the occurrence of particles which are a potential cause of device contamination.

7 Claims, No Drawings

METHOD OF FORMING FINE PATTERNS

BACKGROUND OF THE INVENTION

1. Field of the Invention

This invention relates to a method of forming fine patterns in the field of photolithographic technology. More particularly, the invention relates to a method of forming or defining fine patterns, such as hole patterns and trench patterns, that can meet today's requirements for higher packing densities and smaller sizes of semiconductor devices.

2. Description of the Related Art

In the manufacture of electronic components such as semiconductor devices and liquid-crystal devices, there is employed the photolithographic technology which, in order to perform a treatment such as etching on the substrate, first forms a film (photoresist layer) over the substrate using a so-called radiation-sensitive photoresist which is sensitive to activating radiations, then performs exposure of the film by selective illumination with an activating radiation, performs development to dissolve away the photoresist layer selectively to form an image pattern (photoresist pattern), and forms a variety of patterns including contact providing patterns such as a hole pattern and a trench pattern using the photoresist pattern as a protective layer (mask pattern).

With the recent increase in the need for higher packing densities and smaller sizes of semiconductor devices, increasing efforts are being made to form sufficiently fine-line patterns and submicron-electronic fabrication capable of forming patterns with linewidths of no more than 0.20 µm is currently required. As for the activating light rays necessary in the formation of mask patterns, short-wavelength radiations such as KrF, ArF and $F_2$ excimer laser beams and electron beams are employed. Further, active R&D efforts are being made to find photoresist materials as mask pattern formers that have physical properties adapted to those short-wavelength radiations.

In addition to those approaches for realizing submicron-electronic fabrication which are based on photoresist materials, active R&D efforts are also being made on the basis of pattern forming method with a view to finding a technology that can provide higher resolutions than those possessed by photoresist materials.

For example, JP-5-166717A discloses a method of forming fine patterns which comprises the steps of defining patterns (=photoresist-uncovered patterns) into a pattern-forming resist on a substrate, then coating over entirely the substrate with a mixing generating resist that is to be mixed with said pattern-forming resist, baking the assembly to form a mixing layer on both sidewalls and the top of the pattern-forming resist, and removing the non-mixing portions of said mixing generating resist such that the feature size of the photoresist-uncovered pattern is reduced by an amount comparable to the dimension of said mixing layer. JP-5-241348 discloses a pattern forming method comprising the steps of depositing a resin, which becomes insoluble in the presence of an acid, on a substrate having formed thereon a resist pattern containing an acid generator, heat treating the assembly so that the acid is diffused from the resist pattern into said resin insoluble in the presence of an acid to form a given thickness of insolubilized portion of the resist near the interface between the resin and the resist pattern, and developing the resist to remove the resin portion through which no acid has been diffused, thereby ensuring that the feature size of the pattern is reduced by an amount comparable to the dimension of said given thickness.

However, in these methods, it is difficult to control the thickness of layers to be formed on the sidewalls of resist patterns. In addition, the in-plane heat dependency of wafers is as great as ten-odd nanometers per degree Celsius, so it is extremely difficult to keep the in-plane uniformity of wafers by means of the heater employed in current fabrication of semiconductor devices and this leads to the problem of occurrence of significant variations in pattern dimensions.

Another approach known to be capable of reducing pattern dimensions is by fluidizing resist patterns through heat treatment and the like. For example, JP-1-307228A discloses a method comprising the steps of forming a resist pattern on a substrate and applying heat treatment to deform the cross-sectional shape of the resist pattern, thereby defining a fine pattern. In addition, JP-4-364021A discloses a method comprising the steps of forming a resist pattern and heating it to fluidize the resist pattern, thereby changing the dimensions of its resist pattern to form or define a fine-line pattern.

In these methods, the wafer's in-plane heat dependency is only a few nanometers per degree Celsius and is not very problematic. On the other hand, it is difficult to control the resist deformation and fluidizing on account of heat treatment, so it is not easy to provide a uniform resist pattern in a wafer's plane.

An evolved version of those methods is disclosed in JP-7-45510A and it comprises the steps of forming a resist pattern on a substrate, forming a stopper resin on the substrate to prevent excessive thermal fluidizing of the resist pattern, then applying heat treatment to fluidize the resist so as to change the dimensions of its pattern, and thereafter removing the stopper resin to form or define a fine-line pattern. As the stopper resin, a water-soluble resin, specifically, polyvinyl alcohol is employed. However, polyvinyl alcohol is not highly soluble in water and cannot be readily removed completely by washing with water, introducing difficulty in forming a pattern of good profile. The pattern formed is not completely satisfactory in terms of stability over time. In addition, polyvinyl alcohol cannot be applied efficiently by coating. Because of these and other problems, the method disclosed in JP-7-45510 has yet to be adopted commercially.

Whirl coating with a spinner or the like is commonly employed to apply coating solutions of water-soluble resins and the like to the substrate. In whirl coating, it is so designed that a film of substantially uniform thickness is formed across the surface of the substrate from the center toward the edges. Actually, however, due to the action of surface tension, the coating solution collects on the periphery of the substrate to form a thicker-walled portion or it even deposits on the edges and back of the substrate which need not be covered with the water-soluble resin. These phenomena are a problem that often causes difficulty in subsequent processing of the substrate. If the substrate carrying the deposit of such unwanted coating solution is subjected to the fabrication process, particles may potentially occur and become a possible contaminant to the device.

JP 2001-281886A discloses a method comprising the steps of covering a surface of a resist pattern with an acidic film made of a resist pattern size reducing material containing a water-soluble resin, rendering the surface layer of the resist pattern alkali-soluble, then removing said surface layer and the acidic film with an alkaline solution to reduce the feature size of the resist pattern. JP-2002-184673A discloses a method comprising the steps of forming a resist pattern on a substrate, then forming a film containing a water-soluble film forming component on said resist pattern, heat treating said resist pattern and film, and immersing the assembly in an aqueous solution of tetramethylammonium hydroxide, thereby forming a fine-line resist pattern without involving a dry etching step. However, both methods are simply directed to reducing the size of resist trace patterns themselves and therefore are totally different from the present invention in object.

SUMMARY OF THE INVENTION

The present invention has been accomplished under these circumstances and has as an object providing a method of forming fine patterns on a substrate having photoresist patterns (mask patterns) as it is covered with an over-coating agent. The method has high ability to control pattern dimensions and provides fine-line patterns that have a satisfactory profile and satisfy the characteristics required of semiconductor devices, with an additional capability of preventing the occurrence of particles which are a potential cause of device contamination.

In order to attain this object, the present invention provides a method of forming fine-line patterns comprising: covering a substrate having photoresist patterns with an over-coating agent for forming fine patterns, removing the unwanted over-coating agent that has been deposited on the edge portions and/or the back side of the substrate, applying heat treatment to cause thermal shrinkage of the over-coating agent so that the spacing between adjacent photoresist patterns is lessened by the resulting thermal shrinking action, and removing the over-coating agent substantially completely.

In a preferred embodiment, the unwanted over-coating agent that has been deposited on the edge portions and/or the back side of the substrate is removed using a remover fluid containing water or a water-soluble organic solvent as a main component.

In another preferred embodiment, the water-soluble organic solvent is at least one member selected from the group consisting of alcoholic solvents, sulfoxide-based solvents, sulfone-based solvents, amide-based solvents, lactam-based solvents, imidazolidinone-based solvents, lactone-based solvents, glycolic solvents and ether-based solvents.

In yet another preferred embodiment, the heat treatment is performed at a temperature that does not cause thermal fluidizing of the photoresist patterns on the substrate.

DETAILED DESCRIPTION OF THE INVENTION

The present invention is described below in greater detail.

The term "the edge portions and/or the back side of the substrate" as used herein refers broadly to the end edges, peripheral edges, the back side and any other areas of the substrate that are not usually needed in the manufacture of semiconductor devices, liquid-crystal display devices, etc.

The method of preparing the substrate used in the present invention having photoresist patterns thereon is not limited to any particular type and it can be prepared by conventional methods employed in the fabrication of semiconductor devices, liquid-crystal display devices, magnetic heads and microlens arrays. In an exemplary method, a photoresist composition of chemically amplifiable or other type is spin- or otherwise coated on a substrate such as a silicon wafer and dried to form a photoresist layer, which is illuminated with an activating radiation such as ultraviolet, deep-ultraviolet or excimer laser light through a desired mask pattern using a reduction-projection exposure system or subjected to electron beam photolithography, then heated and developed with a developer such as an alkaline aqueous solution, typically a 1–10 mass % tetramethylammonium hydroxide (TMAH) aqueous solution, thereby forming a photoresist pattern on the substrate.

The photoresist composition serving as a material from which photoresist patterns are formed is not limited in any particular way and any common photoresist compositions may be employed including those for exposure to i- or g-lines, those for exposure with an excimer laser (e.g. KrF, ArF or $F_2$) and those for exposure to EB (electron beams).

[a.] Over-Coating Agent Application Step

Next, an over-coating agent is applied to cover entirely the said substrate having photoresist patterns (mask patterns) thereon. After applying the over-coating agent, the substrate may optionally be pre-baked at a temperature of 80–100° C. for 30–90 seconds.

The over-coating agent may be applied by any methods commonly employed in the conventional heat flow process. Specifically, an aqueous solution of the over-coating agent for forming fine patterns is applied to the substrate by any known application methods including bar coating, roll coating and whirl coating with a spinner.

The over-coating agent employed in the invention is to cover entirely the substrate having photoresist patterns (mask patterns) thereon, including patterns typified by hole patterns or trench patterns, each of these patterns are defined by spacing between adjacent photoresist patterns (mask patterns). Upon heating, the applied film of over-coating agent shrinks to increase the width of each of the photoresist patterns, thereby narrowing or lessening adjacent hole patterns or trench patterns as defined by spacing between the photoresist patterns and, thereafter, the applied film is removed substantially completely to form or define fine featured patterns.

The phrase "removing the applied film substantially completely" as used herein means that after lessening the spacing between adjacent photoresist patterns by the heat shrinking action of the applied over-coating agent, said film is removed in such a way that no significant thickness of the over-coating agent will remain at the interface with the photoresist patterns. Therefore, the present invention does not include methods in which a certain thickness of the over-coating agent is left intact near the interface with the photoresist pattern so that the feature size of the pattern is reduced by an amount corresponding to the residual thickness of the over-coating agent.

In the present invention, the over-coating agent is preferably employed that contains a water-soluble polymer.

The water-soluble polymer may be any polymer that can dissolve in water at room temperature and various types may be employed without particular limitation; preferred examples include acrylic polymers, vinyl polymers, cellulosic derivatives, alkylene glycol polymers, urea polymers, melamine polymers, epoxy polymers and amide polymers.

Exemplary acrylic polymers include polymers and copolymers having monomeric components, such as acrylic acid, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, acryloylmorpholine, etc.

Exemplary vinyl polymers include polymers and copolymers having monomeric components, such as N-vinylpyrrolidone, vinyl imidazolidinone, vinyl acetate, etc.

Exemplary cellulosic derivatives include hydroxypropylmethyl cellulose phthalate, hydroxypropylmethyl cellulose acetate phthalate, hydroxypropylmethyl cellulose hexahydrophthalate, hydroxypropylmethyl cellulose acetate succinate, hydroxypropylmethyl cellulose, hydroxypropyl cellulose, hydroxyethyl cellulose, cellulose acetate hexahydrophthalate, carboxymethyl cellulose, ethyl cellulose, methylcellulose, etc.

Exemplary alkylene glycol polymers include addition polymers and copolymers of ethylene glycol, propylene glycol, etc.

Exemplary urea polymers include those having methylolurea, dimethylolurea, ethyleneurea, etc. as components.

Exemplary melamine polymers include those having methoxymethylated melamine, methoxymethylated isobutoxymethylated melamine, methoxyethylated melamine, etc. as components.

Among epoxy polymers and amide polymers, those which are water-soluble may also be employed.

It is particularly preferred to employ at least one member selected from the group consisting of alkylene glycol polymers, cellulosic derivatives, vinyl polymers and acrylic polymers. Acrylic polymers are most preferred since they provide ease in pH adjustment. Copolymers comprising acrylic polymers and water-soluble polymers other than acrylic polymers are also preferred since during heat treatment, the efficiency of shrinking the spacing between adjacent photoresist patterns (mask patterns) can be increased while maintaining the shape of the photoresist pattern. The water-soluble polymers can be employed either singly or in combination.

When water-soluble polymers are used as copolymers, the proportions of the components are not limited to any particular values. However, if stability over time is important, the proportion of the acrylic polymer is preferably adjusted to be larger than those of other building polymers. Other than by using excessive amounts of the acrylic polymer, better stability over time can also be obtained by adding acidic compounds such as p-toluenesulfonic acid and dodecylbenzenesulfonic acid.

The over-coating agent for forming fine patterns may additionally contain water-soluble amines. Preferred ones include amines having pKa (acid dissociation constant) values of 7.5–13 in aqueous solution at 25° C. in view of the prevention of the generation of impurities and pH adjustment. Specific examples include the following: alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines, such as triethylamine, 2-ethyl-hexylamine, dioctylamine, tributylamine, tripropylamine, triallylamine, heptylamine and cyclohexylamine; aromatic amines such as benzylamine and diphenylamine; and cyclic amines, such as piperazine, N-methylpiperazine and hydroxyethylpiperazine. Preferred water-soluble amines are those having boiling points of 140° C. (760 mmHg) and above, as exemplified by monoethanolamine and triethanolamine.

If the water-soluble amine is to be added, it is preferably incorporated in an amount of about 0.1–30 mass %, more preferably about 2–15 mass %, of the over-coating agent (in terms of solids content). If the water-soluble amine is incorporated in an amount of less than 0.1 mass %, the coating fluid may deteriorate over time. If the water-soluble amine is incorporated in an amount exceeding 30 mass %, the photoresist pattern being formed may deteriorate in shape.

For such purposes as reducing the dimensions of patterns and controlling the occurrence of defects, the over-coating agent for forming fine patterns may further optionally contain non-amine based, water-soluble organic solvents.

As such non-amine based, water-soluble organic solvents, any non-amine based organic solvents that can mix with water may be employed and they may be exemplified by the following: sulfoxides, such as dimethyl sulfoxide; sulfones, such as dimethylsulfone, diethylsulfone, bis(2-hydroxyethyl)sulfone and tetramethylenesulfone; amides, such as N,N-dimethylformamide, N-methylformamide, N,N-dimethylacetamide, N-methylacetamine and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobuthyl ether, ethylene glycol monomethyl ether acetate, ethylene glycol monoethyl ether acetate, diethylene glycol, diethylene glycol monomethyl ether, diethylene glycol monoethyl ether, diethylene glycol monobuthyl ether, propylene glycol, propylene glycol monomethyl ether, glycerol, 1,2-butylene glycol, 1,3-butylene glycol and 2,3-butylene glycol. Among those mentioned above, polyhydric alcohols and their derivatives are preferred for the purposes of reducing the dimensions of patterns and controlling the occurrence of defects and glycerol is particularly preferred. The non-amine based, water-soluble organic solvents may be used either singly or in combination.

If the non-amine based, water-soluble organic solvent is to be added, it is preferably incorporated in an amount of about 0.1–30 mass %, more preferably about 0.5–15 mass %, of the water-soluble polymer. If the non-amine based, water-soluble organic solvent is incorporated in an amount of less than 0.1 mass %, its defect reducing effect tends to decrease. Beyond 30 mass %, a mixing layer is liable to form at the interface with the photoresist pattern.

In addition, the over-coating agent may optionally contain a surfactant for attaining special effects such as coating uniformity and wafer's in-plane uniformity.

The surfactant is preferably employed that, when added to the water-soluble polymer, exhibits certain characteristics such as high solubility, non-formation of a suspension and miscibility with the polymer component. By using surfactants that satisfy these characteristics, the occurecne of defects can be effectively controlled that is considered to be pertinent to microforming upon coating the over-coating agent.

Preferred suitable surfactant in the invention is at least one member selected among N-alkylpyrrolidones, quaternary ammonium salts and phosphate esters of polyoxyethylene.

N-alkylpyrrolidones as surfactant are preferably represented by the following general formula (I):

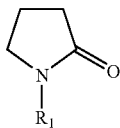
(I)

where $R_1$ is an alkyl group having at least 6 carbon atoms.

Specific examples of N-alkylpyrrolidones as surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone ("SURFADONE LP 100" of ISP Inc.) is preferably used.

Quaternary ammonium salts as surfactant are preferably represented by the following general formula (II):

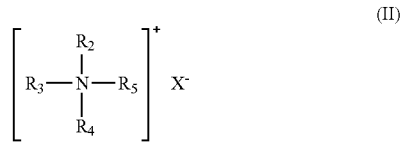
(II)

where $R_2$, $R_3$, $R_4$ and $R_5$ are each independently an alkyl group or a hydroxyalkyl group (provided that at least one of them is an alkyl or hydroxyalkyl group having no more than 6 carbon atoms); $X^-$ is a hydroxide ion or a halogenide ion.

Specific examples of quaternary ammonium salts as surfactant include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide and octadecyltrimethylammonium hydroxide. Among these, hexadecyltrimethylammonium hydroxide is preferably used.

Phosphate esters of polyoxyethylene are preferably represented by the following general formula (III):

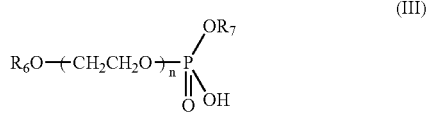
(III)

where $R_6$ is an alkyl or alkylaryl group having 1–10 carbon atoms; $R_7$ is a hydrogen atom or $(CH_2CH_2O)R_6$ (where $R_6$ is as defined above); n is an integer of 1–20.

To mention specific examples, phosphate esters of polyoxyethylene that can be used as surfactants are commercially available under trade names "PLYSURF A212E" and "PLYSURF A210G" from Dai-ichi Kogyo Seiyaku Co., Ltd.

The amount of the surfactant is preferably about 0.1–10 mass %, more preferably about 0.2–2 mass %, of the over-coating agent (in terms of solids content). By adopting the amount as described above ranges, it may effectively prevent the variations in the percent shrinkage of patterns, potentially depending on the wafer's in-plane uniformity which is caused by the deterioration of coating property, and also prevent the occurrence of defects that are considered to have cause-and-effect relations with microfoaming on the applied film that generates as the coating conditions are worsened.

The over-coating agent used in the invention for forming fine patterns is preferably used as an aqueous solution at a concentration of 3–50 mass %, more preferably at 5–30 mass %. If the concentration of the aqueous solution is less than 3 mass %, poor coverage of the substrate may result. If the concentration of the aqueous solution exceeds 50 mass %, there is no appreciable improvement in the intended effect that justifies the increased concentration and the solution cannot be handled efficiently.

As already mentioned, the over-coating agent of the invention for forming fine patterns is usually employed as an aqueous solution using water as the solvent. A mixed solvent system comprising water and an alcoholic solvent may also be employed. Exemplary alcoholic solvents are monohydric alcohols including methyl alcohol, ethyl alcohol, propyl alcohol and isopropyl alcohol. These alcoholic solvents are mixed with water in amounts not exceeding about 30 mass %.

[b.] Step of Removing the Unwanted Over-Coating Agent Deposited on the Edge Portions and/or the Back Side of the Substrate When the over-coating agent is applied in step [a.], particularly by whirl coating using a spinner or the like, the over-coating agent diffuses radially under centrifugal force. The thus applied over-coating agent is sometimes thicker at the peripheral and end edges of the substrate than in its center or the over-coating agent may even get to the back side of the substrate. These unwanted deposits of the over-coating agent can be a cause of the occurrence of particles, which may potentially lead to device contamination, often causing difficulty in subsequent processing of the substrate. In order to avoid these possibilities, the unwanted over-coating agent that has been deposited on at least a portion of the peripheral edges, end edges and back side of the substrate is removed by washing (a procedure commonly called edge rinse or back rinse). This edge rinse step, in which the over-coating agent that has been deposited on the edge portions and/or the back side of the substrate is removed, is effective in preventing device contamination due to the occurrence of particles.

In the step of edge rinsing the water-soluble film of over-coating agent, a remover fluid containing water or a water-soluble organic solvent as a main component is preferably employed.

The remover fluid containing water or a water-soluble organic solvent as a main component is one in which at least one member of the group consisting of water, alcoholic solvents, sulfoxide-based solvents, sulfone-based solvents, amide-based solvents, lactam-based solvents, imidazolidinone-based solvents, lactone-based solvents, glycolic solvents and ether-based solvents is contained as a main component.

Alcoholic solvents include methyl alcohol, ethyl alcohol, propyl alcohol, isopropyl alcohol, glycerol, etc.

Sulfoxide-based solvents include dimethyl sulfoxide (DMSO), etc.

Sulfone-based solvents include dimethylsulfone, diethylsulfone, bis(2-hydroxyethyl)sulfone, tetramethylenesulfone, etc.

Amide-based solvents include N,N-dimethylformamide, N-methylformamide, N,N-dimethylacetamide, N-methylacetamide, N,N-diethylacetamide, etc.

Lactam-based solvents include N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone, etc.

Imidazolidinone-based solvents include 1,3-dimethyl-2-imidazolidinone, 1,3-diethyl-2-imidazolidinone, 1,3-diisopropyl-2-imidazolidinone, etc.

Lactone-based solvents include γ-butyrolactone, δ-valerolactone, etc.

Glycolic solvents include ethylene glycol, ethylene glycol monomethyl ether, ethylene glycol monoethyl ether, ethylene glycol monobuthyl ether, diethylene glycol, diethylene glycol monomethyl ether, diethylene glycol monoethyl ether, propylene glycol, dipropylene glycol, dipropylene glycol monomethyl ether, etc.

Ether-based solvents include dimethyl ether, diethyl ether, dipropyl ether, methyl phenyl ether (i.e., anisole), etc.

These water-soluble organic solvents may be used in admixture of themselves. If desired, those water-soluble organic solvents may be mixed with non-water-soluble organic solvents in amounts that are not detrimental to the advantages of the invention. An example of such non-water-soluble organic solvents is propylene glycol monomethyl ether acetate (PGMEA).

The method of removing the unwanted over-coating agent is not limited in any particular way and a variety of methods can be employed. To mention one example, the remover fluid is dripped or sprayed from a supply nozzle onto the peripheral edges or back side of the rotating substrate. Alternatively, the end edges of the substrate are inserted horizontally into a reservoir filled with the remover fluid, in which they are immersed for a specified period of time.

The removal step is usually performed for 15–120 seconds.

Step [b.] is preferably performed prior to or during the step of drying the over-coating agent as applied to the substrate having the photoresist patterns. Alternatively, step [b.] may be performed after the drying step before the ensuing step of heat treatment (for causing thermal shrinkage).

[c.] Heat Treatment (Thermal Shrinkage) Step

In the next step, heat treatment is performed to cause thermal shrinkage of the film of the over-coating agent. Under the resulting force of thermal shrinkage of the film, the dimensions of the photoresist pattern in contact with the film will increase by an amount equivalent to the thermal shrinkage of the film and, as the result, the photoresist pattern widens and accordingly the spacing between adjacent photoresist patterns lessens. The spacing between adjacent photoresist patterns determines the diameter or width of the pattern elements to be finally obtained, so the decrease in the spacing between adjacent photoresist patterns contributes to reducing the diameter of each element of a hole pattern or the width of each element of a trench pattern, eventually leading to the definition of a pattern with smaller feature sizes.

The heating temperature is not limited to any particular value as long as it is high enough to cause thermal shrinkage of the film of the over-coating agent and form or define a fine pattern. Heating is preferably done at a temperature that will not cause thermal fluidizing of the photoresist pattern. The temperature that will not cause thermal fluidizing of the photoresist pattern is such a temperature that when a substrate on which the photoresist pattern has been formed but no film of the over-coating agent has been formed is heated, the photoresist pattern will not experience any dimensional changes. Performing a heat treatment under such temperature conditions is very effective for various reasons, e.g. a fine-line pattern of good profile can be formed more efficiently and the duty ratio in the plane of a wafer, or the dependency on the spacing between photoresist patterns in the plane of a wafer, can be reduced. Considering the softening points of a variety of photoresist compositions employed in current photolithographic techniques, the preferred heat treatment is usually performed within a temperature range of about 80–160° C. for 30–90 seconds, provided that the temperature is not high enough to cause thermal fluidizing of the photoresist.

The thickness of the film of the over-coating agent for the formation of fine-line patterns is preferably just comparable to the height of the photoresist pattern or high enough to cover it.

[d.] Over-Coating Agent Removal Step

In the subsequent step, the remaining film of the over-coating agent on the patterns is removed by washing with an aqueous solvent, preferably pure water, for 10–60 seconds. Prior to washing with water, rinsing may optionally be performed with an aqueous solution of alkali (e.g. tetramethylammonium hydroxide (TMAH) or choline). The over-coating agent in the present invention is easy to remove by washing with water and it can be completely removed from the substrate and the photoresist pattern.

As a result, each pattern on the substrate has a smaller feature size because each pattern is defined by the narrowed spacing between the adjacent widened photoresist patterns.

The fine-line pattern thus formed using the over-coating agent of the present invention has a pattern size smaller than the resolution limit attainable by the conventional methods. In addition, it has a good enough profile and physical properties that can fully satisfy the characteristics required of semiconductor devices.

Steps [a.]–[d.] may be repeated several times. By repeating steps [a.]–[d.] several times, the photoresist trace patterns (mask patterns) can be progressively widened. Performing the edge rinse step after each application of the over-coating agent offers the advantage that even in the case of using a substrate having thick-film photoresist patterns, fine-line patterns of good profile can be formed on the substrate without causing pattern distortion or deformation.

The technical field of the present invention is not limited to the semiconductor industry and it can be employed in a wide range of applications including the fabrication of liquid-crystal display devices, the production of magnetic heads and even the manufacture of microlens arrays.

EXAMPLES

The following examples are provided for further illustrating the present invention but are in no way to be taken as limiting. Unless otherwise noted, all amounts of ingredients are expressed in mass %.

Example 1

A copolymer of acrylic acid and vinylpyrrolidone [6.36 g; acrylic acid/vinylpyrrolidone=2:1 (polymerization ratio)], triethanolamine (0.58 g) and a polyoxyethyelene phosphate ester surfactant (0.06 g; "PLYSURF A210G", product of Dai-ichi Kogyo Seiyaku Co, Ltd.) were dissolved in water (93 g) to prepare an over-coating agent having the overall solids content adjusted to 7.0 mass %.

A substrate was whirl coated with a positive-acting photoresist TDUR-P036PM (product of Tokyo Ohka Kogyo Co., Ltd.) and baked at 80° C. for 90 seconds to form a photoresist layer in a thickness of 0.48 μm.

The photoresist layer was exposed with an exposure unit (Canon EPA-3000, product of Canon Inc.), subjected to heat treatment at 120° C. for 90 seconds and developed with an aqueous solution of 2.38 mass % TMAH (tetramethylammonium hydroxide) to form photoresist patterns which defined hole patterns with an each diameter of 180.1 nm (i.e., the spacing between the photoresist patterns, or the initial hole dimension, was 180 nm).

The previously prepared over-coating agent was applied onto the substrate including hole patterns and subjected to heat treatment at 116° C. for 60 seconds, thereby reducing the each size of the hole patterns.

Subsequently, the substrate was brought into contact with pure water for 30 seconds to remove (edge rinse) the over-coating agent. The each diameter of the hole patterns was reduced to 158.2 nm.

The thus obtained patterns had a good profile and was free from the occurrence of particles that were a potential cause of device contamination.

Example 2

The same procedure as described in Example 1 was repeated, except that a solvent system consisting of a mixture of y-butyrolactone and anisole (95:5 by mass) was used as the remover of over-coating agent. As in Example 1, the obtained hole patterns were reduced in size, had a good profile and was free from the occurrence of particles that were a potential cause of device contamination.

Example 3

The same procedure as described in Example 1 was repeated, except that a solvent system consisting of a mixture of propylene glycol monomethyl ether (PGME) and propylene glycol monomethyl ether acetate (PGMEA) (7:3 by mass) was used as the remover of over-coating agent and that edge rinse was performed with the substrate kept in contact with pure water for 60 seconds. As in Example 1, the obtained hole patterns were reduced in size, had a good profile and was free from the occurrence of particles that were a potential cause of device contamination.

Comparative Example 1

The same procedure as described in Example 1 was repeated, except that no step of removing the over-coating agent was applied. The obtained hole patterns were reduced in size as in Example 1, but it was shown to have particles that were a potential cause of device contamination.

Comparative Example 2

The same procedure as described in Example 1 was repeated, except that propylene glycol monomethyl ether acetate (PGMEA) alone was used as the remover of over-coating agent. The obtained hole patterns were reduced in size as in Example 1; however, the unwanted color former could not completely be removed from the edge portions of the substrate, and the interface between the photoresist patterns and the over-coating agent which provided on the spacing between adjacent photoresist was not uniform, potentially generating particles that could lead to device contamination.

As described above in detail, the technology of the present invention employs a method of forming fine-line patterns comprising the steps of applying an over-coating agent to a substrate having photoresist patterns (mask patterns) thereon, performing heat treat treatment to cause thermal shrinkage of the applied over-coating agent so that the spacing between adjacent photoresist patterns is lessend under the resulting thermal shrinking action and subsequently removing the film of over-coating agent; the process of the invention includes an additional step after the application of the over-coating agent, in which the unwanted over-coating agent deposited on the edge portions and/or the back side of the substrate is removed and this contributes to forming fine-line patterns of good profile while preventing the occurrence of particles that could lead to device contamination.

What is claimed is:

1. A method of forming fine patterns comprising: covering a substrate having photoresist patterns with an over-coating agent for forming fine patterns, removing the unwanted over-coating agent that has been deposited on the edge portions and/or the back side of the substrate, applying heat treatment to cause thermal shrinkage of the over-coating agent so that the spacing between adjacent photoresist patterns is lessened by the resulting thermal shrinking action, and removing the over-coating agent substantially completely.

2. The method of forming fine patterns according to claim 1, wherein the unwanted over-coating agent that has been deposited on the edge portions and/or the back side of the substrate is removed using a remover fluid containing water or a water-soluble organic solvent as a main component.

3. The method of forming fine patterns according to claim 2, wherein the water-soluble organic solvent is at least one member selected from the group consisting of alcoholic solvents, sulfoxide-based solvents, sulfone-based solvents, amide-based solvents, lactam-based solvents, imidazolidinone-based solvents, lactone-based solvents, glycolic solvents and ether-based solvents.

4. The method of forming fine patterns according to claim 1, wherein the over-coating agent contains a water-soluble polymer.

5. The method of forming fine patterns according to claim 4, wherein the water-soluble polymer is at least one member selected from the group consisting of alkylene glycolic polymers, cellulosic derivatives, vinyl polymers, acrylic polymers, urea polymers, epoxy polymers, melamine polymers and amide polymers.

6. The method of forming fine patterns according to claim 1, wherein the over-coating agent is an aqueous solution having a solids content of 3–50 mass %.

7. The method of forming fine patterns according to claim 1, wherein the heat treatment is performed at a temperature that does not cause thermal fluidizing of the photoresist patterns on the substrate.

* * * * *